US010120032B2

United States Patent
Akamine

(10) Patent No.: US 10,120,032 B2
(45) Date of Patent: Nov. 6, 2018

(54) DEVICE AND METHOD FOR ESTIMATING SECONDARY CELL STATUS

(71) Applicant: Primearth EV Energy Co., Ltd., Kosai-shi, Shizuoka (JP)

(72) Inventor: Naoshi Akamine, Hamamatsu (JP)

(73) Assignee: Primearth EV Energy Co., Ltd., Kosai-shi (JP)

( * ) Notice: Subject to any disclaimer, the term of this patent is extended or adjusted under 35 U.S.C. 154(b) by 726 days.

(21) Appl. No.: 14/375,734

(22) PCT Filed: Sep. 18, 2012

(86) PCT No.: PCT/JP2012/073784
§ 371 (c)(1),
(2) Date: Jul. 30, 2014

(87) PCT Pub. No.: WO2013/136559
PCT Pub. Date: Sep. 19, 2013

(65) Prior Publication Data
US 2015/0046108 A1 Feb. 12, 2015

(30) Foreign Application Priority Data

Mar. 13, 2012 (JP) ................................. 2012-055860

(51) Int. Cl.
*G01R 31/36* (2006.01)
*H01M 10/48* (2006.01)
(Continued)

(52) U.S. Cl.
CPC ...... *G01R 31/3648* (2013.01); *B60L 11/1851* (2013.01); *G01R 31/3651* (2013.01);
(Continued)

(58) Field of Classification Search
CPC ............. H01M 10/425; H01M 10/486; H01M 10/482; H01M 10/48; H01M 2010/4271;
(Continued)

(56) References Cited

U.S. PATENT DOCUMENTS 6,016,047 A 1/2000 Notten
6,160,382 A * 12/2000 Yoon .................. G01R 31/3651
320/134

(Continued)

FOREIGN PATENT DOCUMENTS

JP 2000-504477 A 4/2000
JP 2004-286642 A 10/2004
(Continued)

OTHER PUBLICATIONS

Notice of Grounds for Rejection dated Jan. 6, 2014, issued in corresponding Japanese Patent Application No. 2012-055860, filed Mar. 13, 2012, 5 pages.
(Continued)

*Primary Examiner* — Yaovi M Ameh
(74) *Attorney, Agent, or Firm* — Christensen O'Connor Johnson Kindness PLLC

(57) ABSTRACT

Provided is a device for estimating secondary cell status using multiple models. The device for estimating secondary cell status uses multiple models, model 1, model 2, and model 3, to estimate the status of respective secondary cells. An arithmetic unit compares the estimated voltage values obtained from model 1, model 2, and model 3 with measured voltage values, sets the model having the highest correlation as the optimal model, optimizes the parameters of such model, and estimates secondary cell status.

12 Claims, 11 Drawing Sheets

(51) Int. Cl.
  *H01M 10/42*   (2006.01)
  *B60L 11/18*   (2006.01)
  *H02J 7/00*   (2006.01)

(52) U.S. Cl.
  CPC ......... *H01M 10/425* (2013.01); *H01M 10/48* (2013.01); *H01M 10/482* (2013.01); *H01M 10/486* (2013.01); *G01R 31/3624* (2013.01); *G01R 31/3658* (2013.01); *H01M 2010/4271* (2013.01); *H02J 7/0021* (2013.01); *Y02T 10/705* (2013.01); *Y02T 10/7011* (2013.01); *Y02T 10/7055* (2013.01)

(58) Field of Classification Search
  CPC ............. G01R 31/3651; B60L 11/1851; Y02T 10/7011; Y02T 10/705; Y02T 10/7055; H02J 7/0021
  See application file for complete search history.

(56) References Cited

U.S. PATENT DOCUMENTS

| | | | | |
|---|---|---|---|---|
| 9,720,046 | B2* | 8/2017 | Tazoe | G01R 31/3624 |
| 2003/0184307 | A1* | 10/2003 | Kozlowski | B60L 3/0046 |
| | | | | 324/427 |
| 2003/0204328 | A1* | 10/2003 | Tinnemeyer | G01R 31/3606 |
| | | | | 702/30 |
| 2007/0299620 | A1 | 12/2007 | Yun | |
| 2010/0033132 | A1* | 2/2010 | Nishi | B60K 6/365 |
| | | | | 320/136 |
| 2011/0060539 | A1 | 3/2011 | Sciaretta | |
| 2011/0196633 | A1 | 8/2011 | Abe | |
| 2013/0030737 | A1* | 1/2013 | Okada | G01R 31/3651 |
| | | | | 702/63 |
| 2015/0115969 | A1* | 4/2015 | Ishida | G01R 31/3624 |
| | | | | 324/426 |
| 2016/0003912 | A1* | 1/2016 | Iwane | H02J 7/0021 |
| | | | | 702/63 |

FOREIGN PATENT DOCUMENTS

| | | |
|---|---|---|
| JP | 2008-10420 A | 1/2008 |
| JP | 2009-103471 A | 5/2009 |
| JP | 2011-519118 A | 6/2011 |
| WO | 2011/039912 A1 | 4/2011 |

OTHER PUBLICATIONS

Translation of International Preliminary Report on Patentability dated Oct. 9, 2014, issued in corresponding International Application No. PCT/JP2012/073784, filed Sep. 18, 2012, 4 pages.
International Search Report dated Dec. 25, 2012, issued in corresponding International Application No. PCT/JP2012/073784, filed Sep. 18, 2012, 2 pages.

* cited by examiner

DEVICE AND METHOD FOR ESTIMATING SECONDARY CELL STATUS

TECHNICAL FIELD

The present invention relates to a device and a method for estimating a secondary cell status and, more particularly, to a status estimation technique using a plurality of battery models.

BACKGROUND ART

Hitherto-known techniques include estimating a charge status (SOC: State of Charge) of a secondary cell, such as a nickel-metal hydride secondary cell and a lithium ion secondary cell and controlling charge and discharge of the secondary cell in accordance with the thus-estimated SOC.

Patent Document 1 to be referred to hereunder discloses a battery management system comprised of: a sensing section for measuring a charge-and-discharge current flowing into a battery and a temperature and a terminal voltage of the battery; a prediction section for presuming an SOC of the battery by integration of the charge-and-discharge current; a data rejection section for generating data pertinent to an error attributable to a measurement model in accordance with a rate of change over time in at least any one of factors: the battery temperature, the charge-and-discharge current, the SOC, and charge-and-discharge current; and a measurement section for making a correction to the estimated SOC of the battery by utilization of the measurement model and the data pertinent to the error. To be specific, the data rejection section sets a circuit equivalent to a modeled battery as a measurement model and generates a gain commensurate with variance that is the error attributable to the measurement model. A Kalman gain is generated by utilization of the gain commensurate with variance that is the error attributable to the measurement model, and a correction is made to the estimated SOC by utilization of the thus-generated Kalman gain.

Specifically, the prediction section predicts the SOC of the battery, which is a state variable (x), and a voltage Vdiff applied to diffusion impedance by utilization of an equation of state. The prediction section generates a predicted state variable and covariance that is an error in prediction of the state variable, supplying them to the measurement section. The measurement section predicts a value that can be measured by utilization of the SOC predicted by the prediction section and the voltage Vdiff; namely, a terminal voltage of the battery. The measurement section employs a differential form of equation in order to solve nonlinearity between the SOC and an OCV and use the Kalman filter. The measurement section generates a Kalman gain in order to make a correction to the predicted SOC and the voltage Vdiff. The Kalman gain is set to value that minimizes the covariance.

Patent Document 2 describes detecting an SOC from a relationship between a charge voltage and a charge current acquired during recharge of a battery when the SOC is high and close to an upper limit of a control region and detecting an SOC from a relationship between a discharge voltage and a discharge current when the SOC is low and close to a lower limit of the control region.

Patent Document 3 describes reconfiguring an internal characteristic of an electrochemical cell by use of a mathematical battery model in applications for hybrid vehicles and electric vehicles. Specifically, the descriptions refer to establishing a model comprised of: a mathematical expression, which takes into account an interface temperature, of a reaction rate of an electrochemical reaction occurring in an interface between electrodes and an electrolyte; an electrical expression of spatial accumulation of electrical charges on each of the electrodes; a balance of electrical charges in each of a solid phase and a liquid phase (the electrolyte); a balance of substance in all phases of a system; and a balance of energy of the system that calculates a temperature of a rechargeable electrochemical system, and also refers to calculating time-varying fluctuations in internal electrochemical variable. The descriptions additionally refer to an electrical potential of they system being recorded as an output signal.

RELATED-ART DOCUMENTS

Patent Documents

Patent Document 1: 2008A 10420
Patent Document 2: 2004A 286642
Patent Document 3: International Publication WO 2011/519118

SUMMARY OF THE INVENTION

Although a technique for estimating an internal status of the secondary cell by use of a preset model is effective, an estimation error will increase if the preset model does not adapt to an actual behavior of the secondary cell.

Accordingly, a conceivable measure is to preliminarily assume a plurality of models and estimate the internal status of the secondary cell by use of the plurality of models. However, the key of the measure is how to process a result estimated from the plurality of models to obtain a final estimation result. To be specific, if an average for the plurality of models is taken as an estimation result, an error will become greater when any of the models includes a great divergence from the actual behavior of the battery. When a plurality of models are employed, it becomes necessary to accurately determine which one of the models most accurately reflects the actual behavior of the battery.

The present invention provides a device and a method that enable enhancement of estimation accuracy by appropriate selection of an optimum model reflecting actual behavior of a battery in connection with a device for estimating a secondary cell status by use of a plurality of models.

The present invention provides a device for estimating a secondary cell status comprising: voltage detection means for detecting a voltage of the secondary cell; and computation means for estimating the secondary cell status by use of a plurality of models, the means including comparing estimated voltage values acquired from the plurality of models with a tendency of change in voltage value for a predetermined period detected by the voltage detection means, selecting a model whose tendency is most similar to the tendency as an optimum model from among the plurality of models, and estimating the secondary cell status by use of the selected optimum model. The present invention also provides a method for estimating a secondary cell status comprising: a voltage detection step of detecting a voltage of the secondary cell; and a computation step of estimating the secondary cell status by use of a plurality of models, the computation step including comparing estimated voltage values acquired respectively from the plurality of models with a tendency of change in voltage value for a predetermined period acquired in the voltage detection step, selecting as an optimum model a model having most similar tendency from among the plurality of models, and estimating the secondary cell status by use of the selected optimum model.

In one embodiment of the present invention, the computation means compares the estimated voltage values acquired from the plurality of models with the voltage value detected by the voltage detection means and selecting, as an optimum model, a model exhibiting highest correlation between the estimated voltage value and the voltage value.

In another embodiment of the present invention, the computation means optimizes a parameter used in the optimum model by use of the voltage value detected by the voltage detection means, thus estimating the secondary cell status.

In yet another embodiment of the present invention, the computation means optimizes parameters used respectively in the plurality of models by use of the voltage value detected by the voltage detection means and selects, as an optimum model, a model involving least change in an amount of parameter correction from among the plurality of models having the optimized parameters.

In still another embodiment of the present invention, the computation means estimates the secondary cell status by switching between first processing and second processing in which the first processing includes comparing the estimated voltage values acquired from the plurality of models with the voltage value detected by the voltage detection means, selecting as an optimum model a model exhibiting the highest correlation between the estimated voltage value and the voltage value, and optimizing a parameter used in the optimum model by use of the voltage value detected by the voltage detection means and in which the second processing includes optimizing parameters used respectively in the plurality of models by use of the voltage value detected by the voltage detection means and selecting as an optimum model a model exhibiting least change in an amount of change in parameter correction acquired in the plurality of models, thus estimating the secondary cell status.

According to the present invention, an optimum model is selected by use of an actually detected voltage value, whereby an optimum model reflecting actual behavior of a battery can be appropriately selected, so accuracy of estimation of secondary cell status can be enhanced.

EMBODIMENTS FOR IMPLEMENTING THE INVENTION

Embodiments of the invention are hereunder described by reference to the drawings, by taking a hybrid electric vehicle as an example. Although the hybrid electric vehicle, which is one of electric vehicles, are exemplified in the embodiment, the present invention can also be applied to other electric vehicles using motors as drive sources.

First Embodiment

Figure 1:
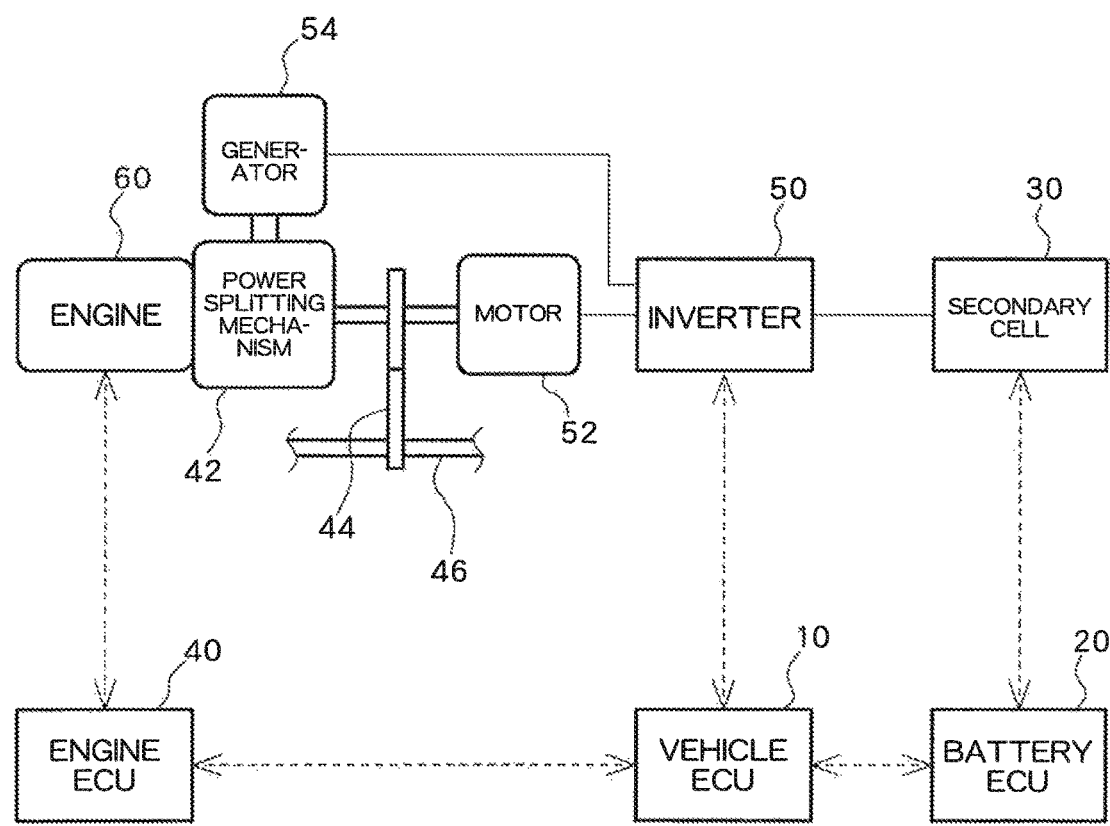
FIG. 1 is a block diagram of a system of an embodiment.

FIG. 1 illustrates a general configuration of a hybrid electric vehicle. A vehicle ECU 10 controls an inverter 50 and an engine ECU 40. The engine ECU 40 controls an engine 60. A battery ECU 20 acts as a state-of-charge estimation device and estimates a state of charge (SOC) of a secondary cell 30 by receiving from the secondary cell 30 data pertaining to a battery voltage V, a charge-and-discharge current I, a battery temperature T, and the like. The battery ECU 20 transmits battery data, like an SOC and a battery temperature of the second cell 30, to the vehicle ECU 10. The vehicle ECU 10 controls the engine ECU 40, the inverter 50, and others, on the basis of various types of battery data, thereby controlling charge and discharge of the secondary cell 30.

The secondary cell 30 supplies power to a motor 52. The inverter 50 converts d.c. power supplied from the secondary cell 30 into a.c. power during discharge of the secondary cell 30, supplying the a.c. power to the motor 52.

The engine 60 transmits power to wheels by way of a power splitting mechanism 42, a decelerator 44, and a drive shaft 46. The motor 52 transmits the power to the wheels by way of the decelerator 44 and the drive shaft 46. When the secondary cell 30 needs to be charged, a portion of the power of the engine 60 is supplied to a generator 54 by way of the power splitting mechanism 42 and utilized for charging.

On the basis of data pertinent to an operating status of the engine 60 sent from the engine ECU 22; driving data, like a degree of depression of an accelerator pedal, a degree of depression of a brake pedal, and a shift range set by means of a shift lever; and battery data, like an SOC sent from the battery ECU 20, the vehicle ECU 10 outputs a control command to the engine ECU 40 and the inverter 50, thereby actuating the engine 60 and the motor 52.

Figure 2:
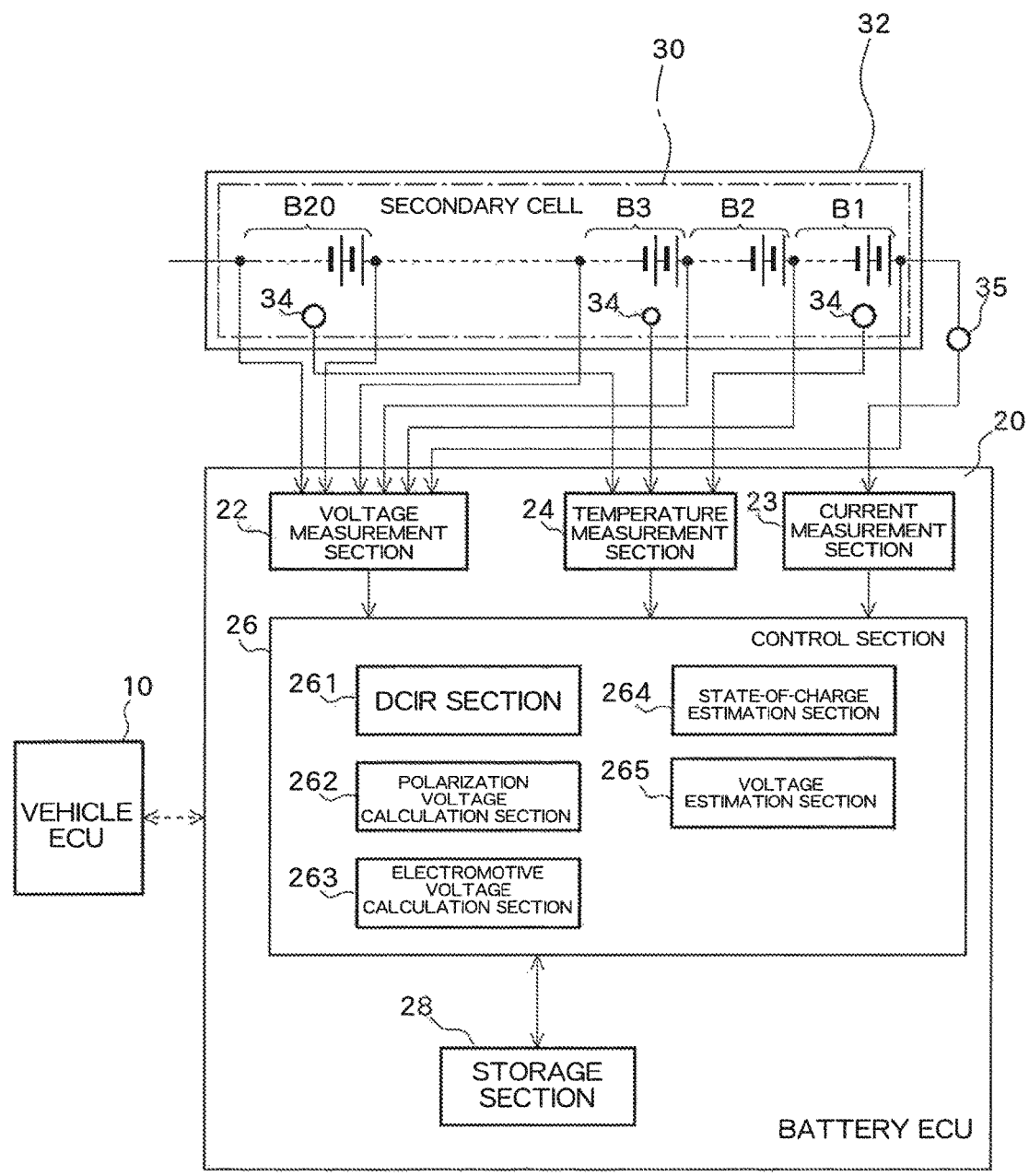
FIG. 2 is a block diagram of a battery ECU.

FIG. 2 illustrates a configuration of the secondary cell 30 and the battery ECU 20. The secondary cell 30 is made by a series connection of; for instance, battery blocks B1 to B20. The battery blocks B1 to B20 are accommodated in a battery case 32. Each of the battery blocks B1 to B20 is formed by a series electrical connection of a plurality of battery modules, and each of the battery modules is made by a series electrical connection of a plurality of electric cells (cells). A plurality of temperature sensors 34 are placed in the battery case 32.

A configuration of the battery ECU 20 is now described. In the embodiment, the battery ECU 20 corresponds to a device for estimating a secondary cell status.

A voltage measurement section 22 measures a terminal voltage of the secondary cell 30. The voltage measurement section 22 measures a terminal voltage of each of the battery blocks B1 to B20, outputting the thus-measured terminal voltages to a control section 26. The control section 26 stores the measured terminal voltage values in a storage section 28. Voltage data are output to the control section 26 at every predetermined period; for instance, 100 msec. The control section 26 calculates the battery voltage V by summing up the terminal voltages of the respective battery blocks B1 to B20.

A current measurement section 23 measures a charge-and-discharge current I during charge and discharge of the secondary cell 30, outputting the measured current to a control section 26. The control section 26 stores a measured current value and a measured voltage value in the storage section 28. The current measurement section 23 generates a measured current value while putting a minus sign in front of the measured current value during charge and putting a plus sign in front of the measured current value during discharge.

A temperature measurement section 24 measures a battery temperature of the secondary cell 30, outputting the measured temperature to the control section 26. The control section 26 stores temperature data in the storage section 26.

The control section 26 has a DCIR (internal resistance) section 261, a polarization voltage calculation section 262, an electromotive voltage calculation section 263, a state-of-charge estimation section 264, and a voltage estimation section 265. The control section 26 estimates a state of charge (SOC) of the secondary cell 30 by use of a measured current value and a measured voltage value. Estimation of the SOC is carried out by use of a plurality of battery behavior models. Although the number of battery behavior models is arbitrary, explanations are provided in the present embodiment while a case where three models, or Model 1, Model 2, and Model 3, are used is taken as an example. Respective functional blocks illustrated in FIG. 2, such as the DCIR section 261, the polarization voltage calculation section 262, the electromotive voltage calculation section 263, the state-of-charge estimation section 264, and the voltage estimation section 265, are functional blocks used in the models. However, some models may not require use of these functional blocks at all times. Put another word, the functional blocks are not indispensable constituent elements for each of the models. The control section 26 is specifically made up of a microprocessor.

Figure 3:
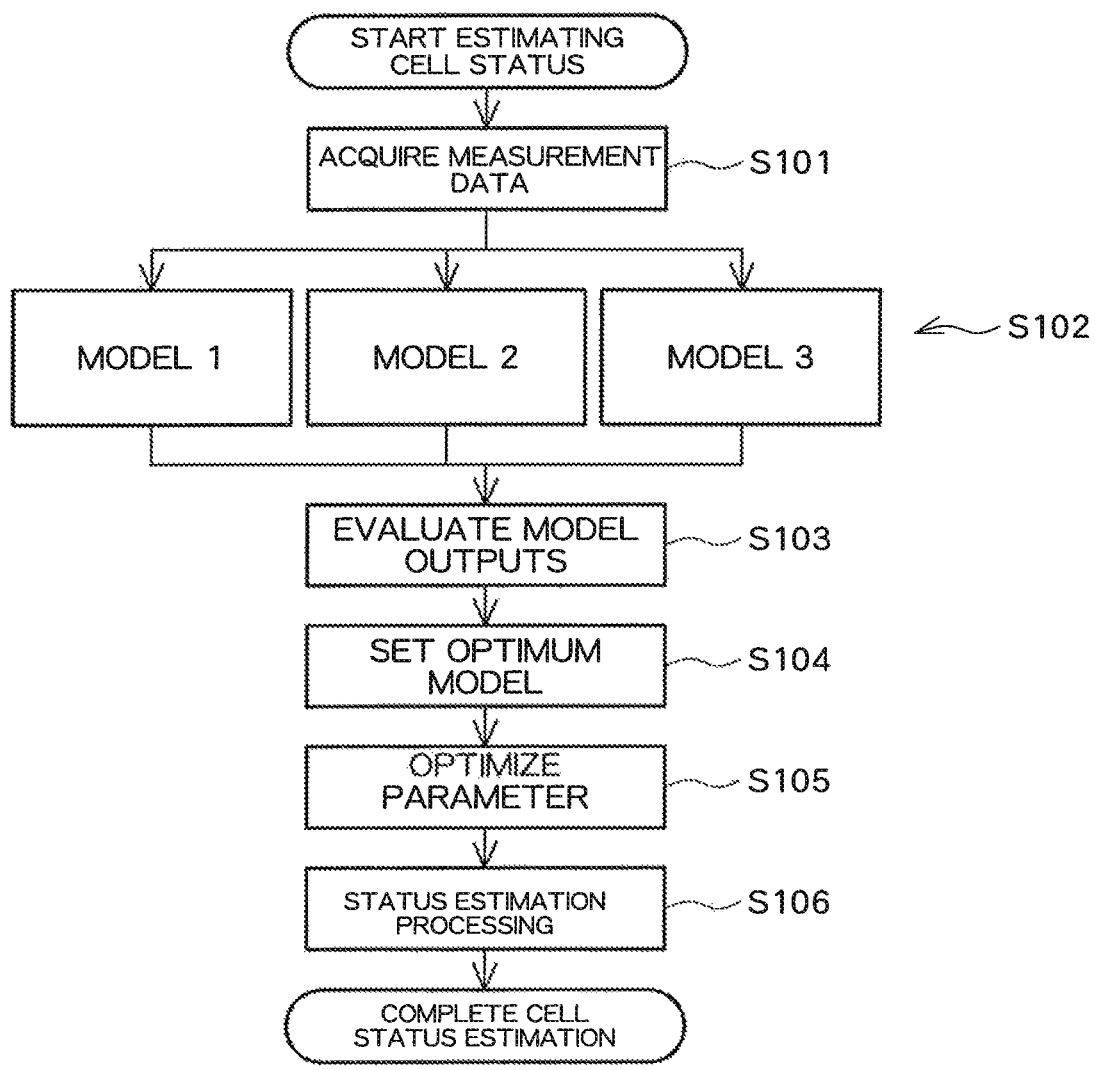
FIG. 3 is a processing flowchart of a first embodiment.

FIG. 3 is a processing flowchart of the control section 26 of the present embodiment. The control section 26 acquires measurement data (S101). To be specific, the measurement data include a voltage value measured by the voltage measurement section 22, a temperature value measured by the temperature measurement section 24, and a current value measured by the current measurement section 23. The control section 26 acquires the measurement data by reading the data stored in the storage section 28.

Next, the control section 26 estimates a voltage of the secondary cell 30 by use of each of the three models, or Model 1, Model 2, and Model 3. More specifically, an estimated voltage value is computed by processing the measurement data by means of Model 1. An estimated voltage value is computed by processing the measurement data by means of Model 2. An estimated voltage value is computed by processing the measurement data by means of Model 3.

After the estimated voltage values are computed by use of Model 1, Model 2, and Model 3, the likelihood of each of the estimated values is evaluated (S103). Specifically, each of the voltage values estimated by Model 1, Model 2, and Model 3 is compared with an actually measured voltage value, thus evaluating accuracy of each of the models. On the basis of results of evaluation of the estimated values of the respective models, the control section 26 selects, as an optimum model, a model considered to be most accurate from among Model 1, Model 2, and Model 3 (S104).

After selecting any model as the optimum model, the control section 26 optimizes a parameter of the selected optimum model (S105). The parameter is one used in computation of the estimated voltage value in each of the models. The parameter does not need to be one but can also be plural. Parameter optimization is performed by use of a measured current value and a measured voltage value. After optimizing the parameter of the optimum model, the control section 26 performs processing for estimating a status of the secondary cell 30 by use of the optimum model, outputting an estimated status (S106). In particular, the control section 26 estimates a state of charge (SOC) of the secondary cell 30 by use of the optimum model whose parameter has been optimized, outputting the thus-estimated SOC.

The models, evaluation of the models, and parameter optimization of the present embodiment are hereunder described one by one.

Figure 4:
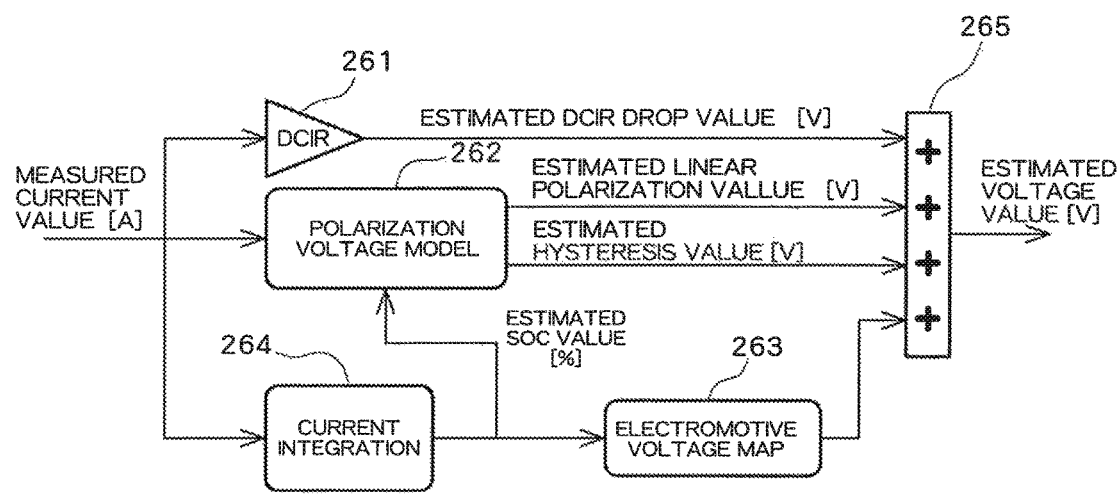
FIG. 4 is a block diagram of Model 1.
Figure 5:
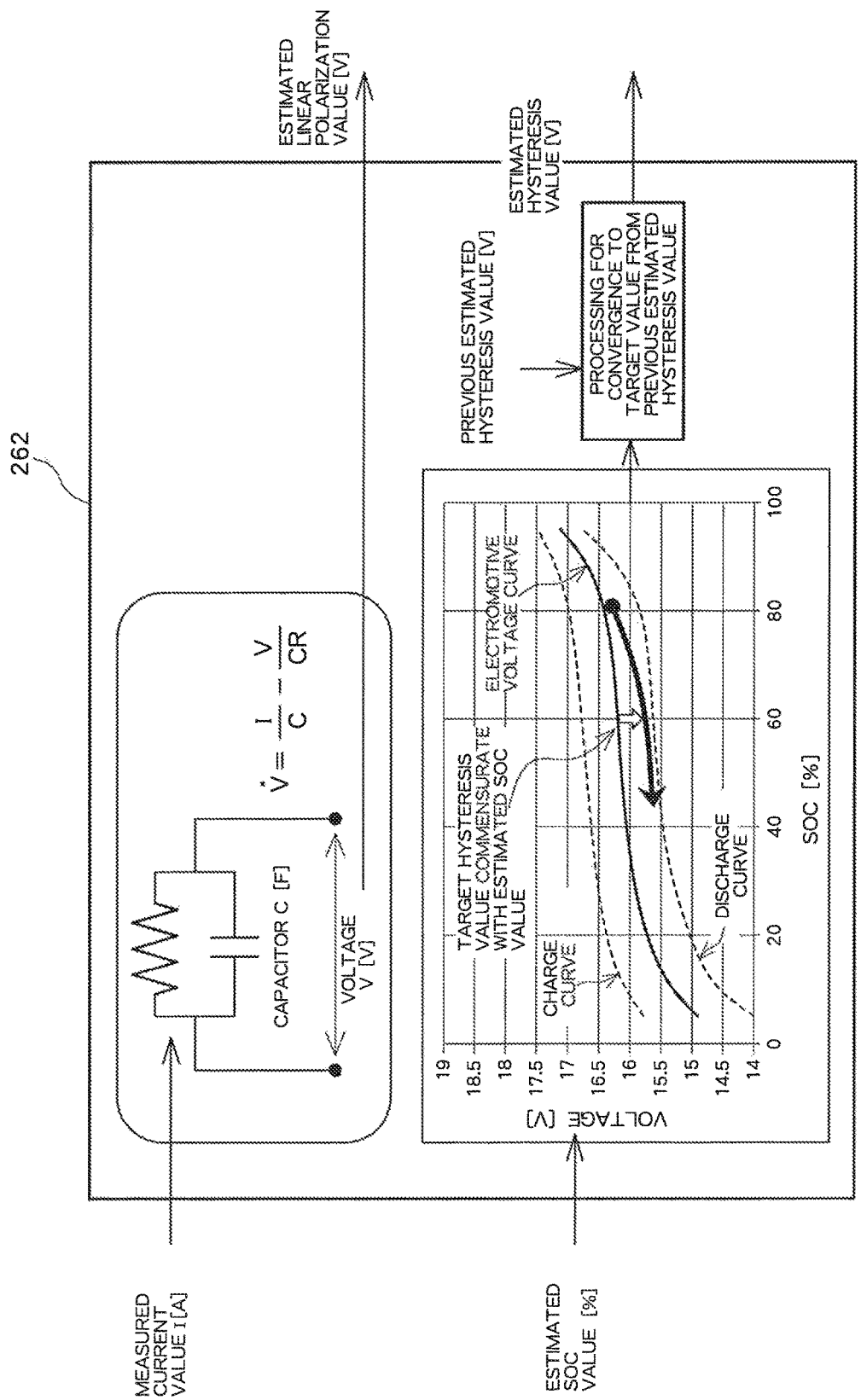
FIG. 5 is a block diagram of a polarization voltage model of Model 1.

FIG. 4 and FIG. 5 illustrate the functional block diagrams of Model 1. FIG. 4 is an overall block diagram of Model 1, illustrating the functional blocks that are executed by respective portions of the control section 26. FIG. 5 is a detailed view of a polarization voltage model illustrated in FIG. 4.

In FIG. 4, the DCIR (internal resistance) block corresponds to the DCIR section 261 illustrated in FIG. 2. The DCIR section preliminarily plots a pair consisting of a measured current value and a measured voltage value; calculates DCIR (internal resistance) of the secondary cell 30 from a gradient of an approximate linear curve; and calculates a potential drop (a voltage drop) by use of the DCIR. The thus-calculated voltage drop (an estimated DCIR drop value) is output to the voltage estimation section 265.

A polarization voltage block corresponds to its counterpart model in the polarization voltage calculation section 262 illustrated in FIG. 2, and the polarization voltage block computes a polarization voltage on the basis of an equivalent circuit model of the polarization voltage. The polarization voltage is computed on premise that the polarization voltage is composed of an estimated linear polarization value and an estimated hysteresis value. The polarization voltage is output to the voltage estimation section 265.

The equivalent circuit of the polarization voltage model is made up of a parallel connection of a resistor R to a capacitor C as illustrated in FIG. 5. A variation $V(\bullet)$ over time in polarization voltage is represented by $V(\bullet)=1/C-V/(CR)$, where symbol ($\bullet$) denotes a time differential. Symbol I also denotes a measured current value. An estimated linear polarization value is calculated and determined by the equation.

In the meantime, the polarization voltage model block is supplied with an estimated SOC value. The estimated SOC value is computed by time integration of a measured current value as will be described later. The polarization voltage model block; namely, the polarization voltage calculation section 262, determines a target hysteresis value commensurate with the estimated SOC value on the basis of a hysteresis relationship between the SOC and the electromotive voltage previously stored in memory. Specifically, the relationship between the SOC and the electromotive voltage has shifted from its original form (an electromotive voltage curve designated by a solid line in the drawing), so a charge side of the curve has changed to a charge curve designated by a broken line in the drawing, and a discharge side of the curve has changed to a discharge curve designated by a broken line in the drawing. Accordingly, at the time of; for instance, discharge, an electromotive voltage commensurate with the estimated SOC value is determined by use of the discharge curve designated by the broken line. The thus-determined electromotive voltage is taken as a target hysteresis value, and the thus-determined target hysteresis value is compared with a previous estimated hysteresis value. Predetermined convergence processing; for instance, calculation of an average for both hysteresis values, is performed, and a result is output as a final estimated hysteresis value. Such convergence processing takes into account a gradual shift of the original electromotive voltage curve to the charge curve or the discharge curve designated by the broken line.

Both the estimated linear polarization value and the estimated hysteresis value that have been calculated as above are output to the voltage estimation section 265.

A current integration block corresponds to the state-of-charge estimation section 264 illustrated in FIG. 2 and calculates an estimated SOC value by time integration of a measured current value. The estimated SOC value obtained by calculation is expressed as a percent (%) while a full charge status is taken as 100. The estimated SOC value is output to the polarization voltage model and the electromotive voltage map. The estimated SOC value output to the polarization voltage model is used in computing an estimated hysteresis value as previously mentioned.

The electromotive voltage map corresponds to the electromotive voltage calculation section 263 illustrated in FIG. 2. A map which memorizes a relationship between an SOC and an electromotive voltage is preliminarily stored in memory, and an electromotive voltage commensurate with an estimated SOC value is determined by reference to the map. The thus-determined electromotive voltage is output to the voltage estimation section 265.

The voltage estimation section 265 receives as inputs the estimated DCIR drop value, the estimated linear polarization value, the estimated hysteresis value, and the electromotive voltage; estimates a terminal voltage of the secondary cell 30 by use of these inputs; and outputs the estimated terminal voltage. To be more precise, the voltage estimation section 265 estimates the terminal voltage by adding up the estimated DCIR drop value, the estimated linear polarization value, the estimated hysteresis value, and the electromotive voltage.

The thus-computed terminal voltage is output as an estimated voltage value.

Figure 6:
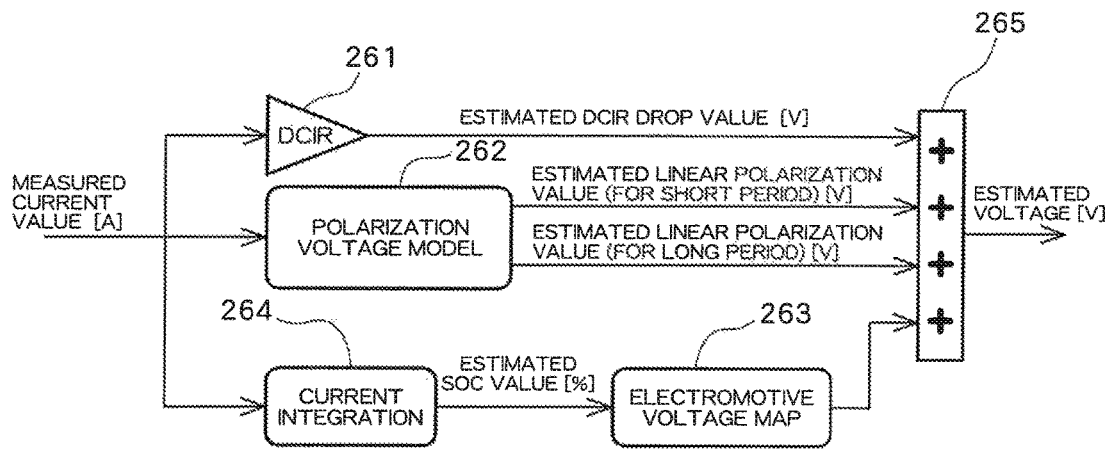
FIG. 6 is a block diagram of Model 2.
Figure 7:
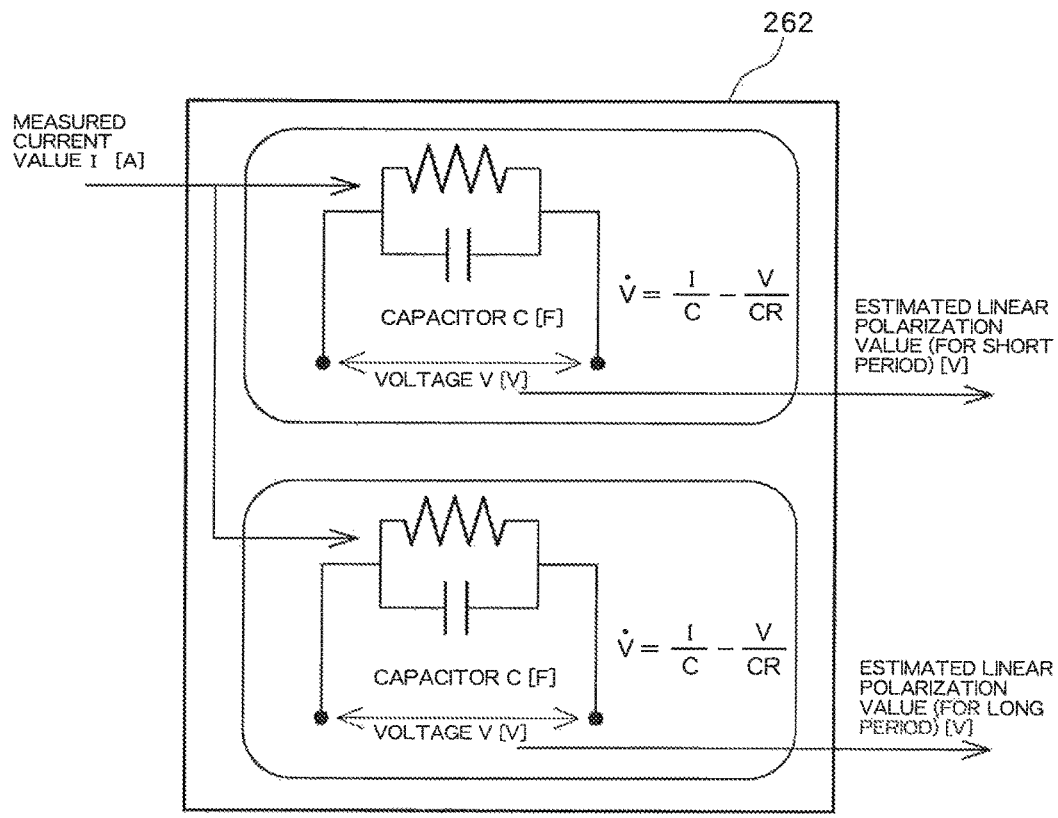
FIG. 7 is a block diagram of a polarization voltage model of Model 2.

FIG. 6 and FIG. 7 illustrate functional block diagrams of Model 2. FIG. 6 is an overall block diagram of Model 2, illustrating functional blocks that are executed by means of the respective portions of the control section 26. FIG. 7 is a detailed view of the polarization voltage model illustrated in FIG. 6.

In FIG. 6, the DCIR (internal resistance) block corresponds to the DCIR section 261 illustrated in FIG. 2. The DCIR block preliminarily plots a pair consisting of a measured current value and a measured voltage value; calculates DCIR (internal resistance) of the secondary cell 30 from the gradient of an approximate first-order curve of the plot; and computes a potential drop (a voltage drop) by use of the DCIR. The thus-calculated voltage drop (an estimated DCIR drop) is output to the voltage estimation section 265.

The polarization voltage model block corresponds to the model of the polarization voltage calculation section 262 illustrated in FIG. 2, and a polarization voltage is computed on the basis of an equivalent circuit model of the polarization voltage.

The polarization voltage is assumed to be composed of a short-term estimated linear polarization value and a long-term estimated linear polarization value. The polarization voltages are output to the estimated voltage section 265.

The equivalent circuit of the polarization voltage model is comprised of a parallel connection of a short-term resistor R with a short-term capacitor C and a parallel connection of a long-term resistor R with a long-term capacitor C. A variation ($\bullet$) over time in polarization voltage is expressed by $V(\bullet)=I/C-V/(CR)$.

Consequently, assume that resistance for short-term polarization is Rps and that capacitance for short-term polarization is Cps, we have $V(\bullet)=I/Cps-V/(CpsRps)$. Assume that resistance for long-term polarization is Rpl and that capacitance for long-term polarization is Cpl, we have $V(\bullet)=I/Cpl-V/(CplRpl)$.

The current integration block corresponds to the state-of-charge estimation section 264 illustrated in FIG. 2 and computes an estimated SOC value by time integration of a measured current value. The estimated SOC value obtained by computation is output to the electromotive voltage map.

The electromotive voltage map corresponds to the electromotive voltage calculation section 263 illustrated in FIG. 2. A map memorizing a relationship between an SOC and an electromotive voltage is preliminarily stored in the memory. An electromotive voltage corresponding to an estimated SOC is determined by reference to the map. The thus-determined electromotive voltage is output to the voltage estimation section 265.

The voltage estimation section 265 receives as inputs the estimated DCIR drop value, the estimated short-term linear polarization value, the estimated long-term linear polarization voltage, and the electromotive voltage; estimates a terminal voltage by use of the inputs; and outputs an estimated terminal voltage. Specifically, the voltage estimation section 265 estimates the terminal voltage by adding up the estimated DCIR drop value, the estimated short-term linear polarization value, the estimated long-term linear polarization value, and the electromotive voltage.

The thus-computed terminal voltage is output as an estimated voltage value.

Figure 8:
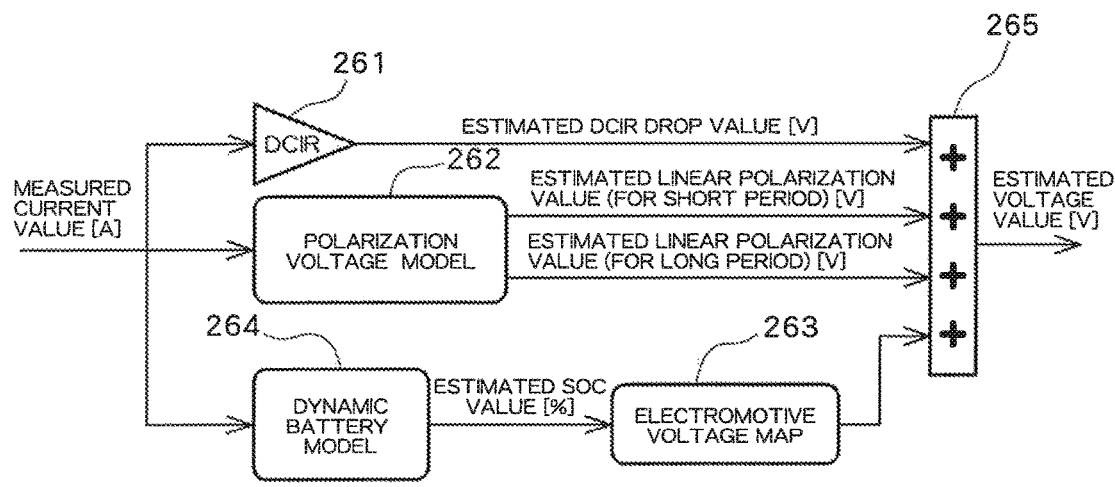
FIG. 8 is a block diagram of Model 3.
Figure 9:
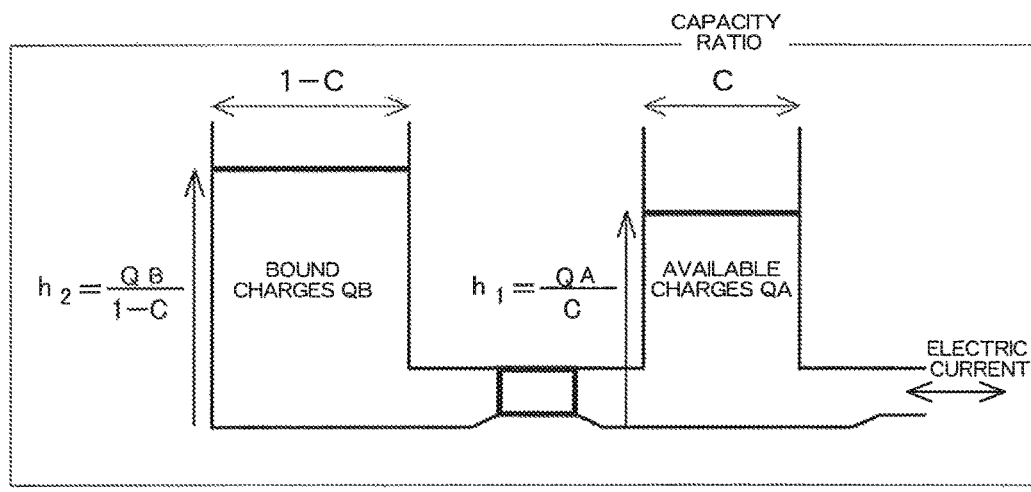
FIG. 9 is an explanatory view of a dynamic battery model of Model 3.

FIG. 8 and FIG. 9 illustrate functional block diagrams of Model 3. FIG. 8 is an overall block diagram of Model 3, illustrating functional blocks that are executed by means of the respective portions of the control section 26. FIG. 9 is a detailed view of the dynamic battery model illustrated in FIG. 8.

In FIG. 8, the DCIR (internal resistance) block corresponds to the DCIR section 261 illustrated in FIG. 2. The DCIR block preliminarily plots a pair consisting of a measured current value and a measured voltage value; calculates DCIR (internal resistance) of the secondary cell 30 from the gradient of an approximate first-order curve of the plot; and computes a potential drop (a voltage drop) by use of the DCIR. The thus-calculated voltage drop (the estimated DCIR drop) is output to the voltage estimation section 265.

The polarization voltage model block corresponds to the model of the polarization voltage calculation section 262 illustrated in FIG. 2, and computes a polarization voltage on the basis of an equivalent circuit model of the polarization voltage.

As in the case with Model 2, the polarization voltage is assumed to be composed of the estimated short-term linear polarization value and the estimated long-term linear polarization value. The polarization voltages are output to the voltage estimation section 265.

The dynamic battery model corresponds to the state-of-charge estimation section 264 illustrated in FIG. 2, and estimates an SOC by use of a predetermined dynamic model of the battery. Specifically, as illustrated in FIG. 9, assume that electric charges are made up of bound charges QB and available charges QA; that a capacity ratio of the bound charges is 1−C; and that a capacity ratio of the available charges is C, a voltage of the bound charges and a voltage of the available charges are expressed as:

$h2=QB/(1-C)$ $h1=QA/C,$ we have dQA/dt=−i+k(h2−h1) and dQB/dt=−k(h2−h1), where symbol "k" designates a parameter. Assume that full charge capacity is Cbatt, an SOC is computed as SOC=QA/Cbatt×100 by use of QA. The thus-computed estimated SOC value is output to the electromotive voltage map.

The electromotive voltage map corresponds to the electromotive voltage calculation section 263 illustrated in FIG. 2. A map memorizing a relationship between an SOC and an electromotive voltage is preliminarily stored in the memory. An electromotive voltages corresponding to an estimated SOC is determined by reference to the map. The thus-determined electromotive voltage is output to the voltage estimation section 265.

The voltage estimation section 265 receive as inputs the estimated DCIR drop value, the estimated short-term linear polarization value, the estimated long-term linear polarization voltage, and the electromotive voltage, and outputs an estimated terminal voltage by use of the inputs. Specifically, the voltage estimation section 265 adds up the estimated DCIR drop value, the estimated short-term linear polarization value, the estimated long-term linear polarization value, and the electromotive voltage, outputting a resultant estimated voltage value.

As above, the control section 26 computes estimated voltage values by use of Model 1, Model 2, and Model 3. The model exhibiting the highest likelihood is selected by evaluation of the likelihood of each of the estimated voltage values.

Figure 10:
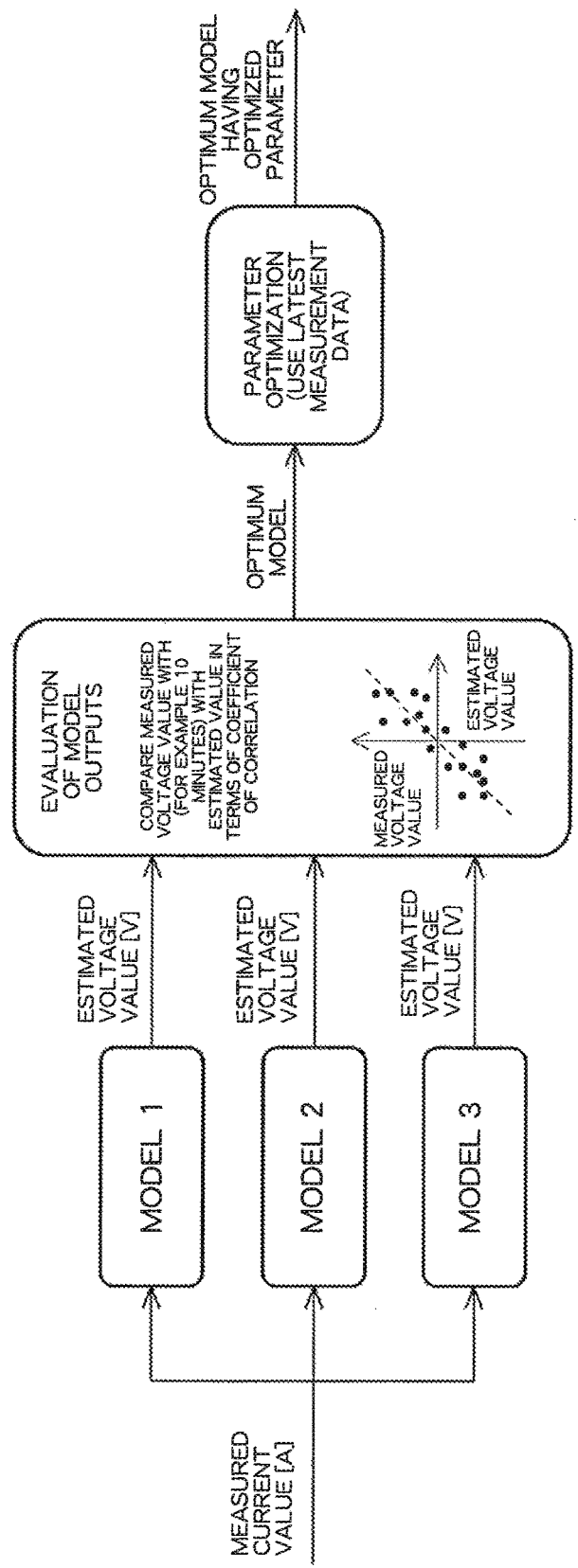
FIG. 10 is an explanatory view of evaluation of the model of the first embodiment.

FIG. 10 illustrates processing pertinent to S103 and S104 illustrated in FIG. 3; namely, processing for evaluating a model output and processing for setting an optimum model.

In evaluation of model outputs, an estimated voltage value of Model 1, an estimated voltage value of Model 2, and an estimated voltage value of Model 3 that have been acquired in a predetermined period of time; for instance, 10 minutes, are respectively compared with an actually measured voltage value, thereby computing respective coefficients of correlation. FIG. 10 illustrates a plot chart in which a horizontal axis represents an estimated voltage value acquired for 10 minutes and in which a vertical axis represents a measured voltage acquired for 10 minutes. A pair (comprised of the estimated voltage value and the measured voltage value) is plotted, and a coefficient of correlation is computed.

A method for calculating a coefficient of correlation is known.

In the setting of an optimum model, the coefficients of correlation computed in connection with Model 1, Model 2, and Model 3 are compared with one another, whereby a model exhibiting the highest degree of correlation (in other words, a model exhibiting the most similar tendency of change) is selected as an optimum model. To be specific, absolute values of the coefficients of correlation of the respective models are compared with one another, and a model exhibiting the largest absolute value is set as an optimum model. For instance, assume that an absolute value of the coefficient of correlation between the estimated voltage value of Model 1 and a measured voltage value is C1; that an absolute value of the coefficient of correlation between the estimated voltage value of Model 2 and the measured voltage value is C2; that an absolute value of the coefficient of correlation between the estimated voltage value of Model 3 and the measured voltage value is C3; and that C1>C2>C3 stands, Model 1 is selected as an optimum model. Suppose C1=C2>C3, either C1 or C2 is selected as an optimum model. Even when C1 and C2 are not absolutely but nearly equal to each other and when C3 is smaller than C1 and C2, C1 or C2 is selected as an optimum model. When an absolute value of a coefficient of correlation is large (when an absolute value of the coefficient of correlation is close to one), excellent correlation exists between an estimated voltage value and a measured voltage value, which means that the estimated voltage value well reflects the measured voltage value. Put another way, a model outputting such an estimated voltage value well reflects the behavior of the secondary cell 30.

Incidentally, the model outputs are evaluated at every predetermined period (every 10 minutes in the embodiment), and hence an optimum model is likewise set at every predetermined period. Accordingly, a model set as an optimum model can change at every predetermined period. For instance, Model 1 is set as an optimum model in connection with data for a certain period of 10 minutes; Model 2 is set as an optimum model in connection with data for the next period of 10 minutes; and Model 3 is set as an optimum model in connection with data for a period of 10 minutes after next. An optimum model complying with changes in situation can be appropriately set. As a matter of course, a predetermined period of 10 minutes is arbitrary and can be made shorter or longer as required. After setting the optimum model, the control section 26 next optimizes parameters of the optimum model.

Figure 11:
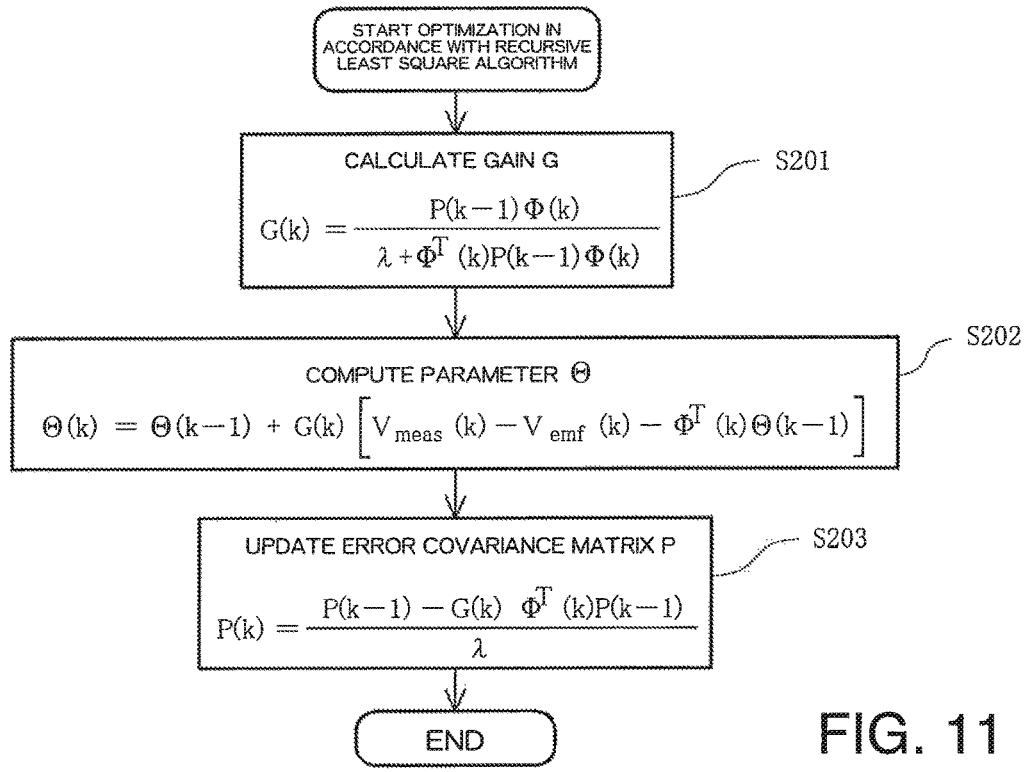
FIG. 11 is an explanatory view of parameter optimization.

FIG. 11 illustrates processing pertaining to S105 illustrated in FIG. 3; namely, parameter optimization processing. Parameter optimization is now described by taking, as an example, a case where Model 1 is set as an optimum model.

In Model 1, the voltage estimation section 265 computes an estimated voltage value as mentioned above by the equation:

Estimated voltage value=electromotive voltage+estimated linear polarization voltage value+estimated hysteresis value+estimated DCIR drop value.

Assume that "k" is a parameter and that

Vbest(k): an estimated voltage value,

Vemf(k): an electromotive voltage,

Vlp(k): an estimated linear polarization voltage value,

Vhys(k): an estimated hysteresis value, and

DCIR•I(k): an estimated DCIR drop value, we have Vbest=Vemf(k)+Vlp(k)+Vhys(k)+DCIR•I(k)=Vemf(k)+{A(k)•Vlp(k−1)+B(k)•(k−1)}+{Fi(k)•Vhys(k−1)+(1−Fi(k))•Mhys(k−1)}+DCIR(k)•I(k).

In relation to the above equation, let estimated linear polarization voltage value={A(k)•Vlp(k−1)+B(k)•I(k−1)}, and also estimated hysteresis value={Fi(k)•Vhys(k−1)+(1−Fi(k))•Mhys(k−1)}.

A(k), B(k), Fi(k), and DCIR(k) are parameters that appear linearly, or parameters that are to be optimized. In addition, Mhys(k) designates a target hysteresis value. Before optimization of the parameters, appropriate values are imparted to the parameters in advance. A recursive least square algorithm (RLS: Recursive Least Square) can be used for parameter optimization.

Vectors Φ and Θ, such as those which will be mentioned below, are now defined.

$\Phi = [Vlp(k-1)\ l(k-1)\ Vhys(k-1)\ Mhys(k-1)\ l(k)]^T$
$\Theta = [A(k)\ B(k)\ Fi(k)\ 1-Fi(k)\ DCIR(k)]^T$ In accordance with the recursive least square algorithm, a gain G is calculated by use of the vectors. To be specific, the gain is calculated by Gain $G(k) = \{P(k-1)\Phi(k)\}/\{\lambda + \Phi^T(k)P(k-1)\Phi(k)\}$ (S201), where P(k): an error covariance matrix. Predetermined values are previously given to initial value Θ(0) and P(0), respectively. Next, if the parameter Θ(k) is updated by use of the calculated gain, it is expressed as $\Theta(k) = \Theta(k-1) + G(k)[Vmeas(k) - Vemf(k) - \Phi^T(k)\ \Theta(k-1)]$ (S202), where Vmeas(k): a measured voltage value, and λ: a forgetting factor. The error covariance matrix P(k) is also updated. More specifically $P(k) = [P(k-1) - G(k)\Phi^T(k)P(k-1)]/\lambda$ (S203).

After updating of Θ(k), computation is integrated at the next time by using Θ(k) as a previous value. Vlp, Vhys, and Mhys are computed from Θ(k) by use of the battery voltage model, and computation is iterated at the next time by using the computation results as previous values. The error is minimized as above, whereby the parameter Θ; namely, A(k), B(k), Fi(k), and DCIR(k) are optimized. Parameters can likewise be optimized even in relation to remaining Model 2 and Model 3. In the first embodiment, Model 1, Model 2, and Model 3 are models for estimating voltages by use of current values measured by the current measurement section 23, and hence parameters are optimized by use of the detected current value and the detected voltage value. However, deepening on a model, a case where parameter optimization is performed by use of another physical quantity (e.g., a temperature measured by the temperature measurement section 24, or the like) also falls within the present invention. Specifically, parameters can be optimized by means of a physical quantity estimated by a model (the voltage in the first embodiment) and another physical quantity (the electric current in the first embodiment) to be input in order to estimate the physical quantity. Naturally, when there are a plurality of physical quantities to be estimated and physical quantities to be input, parameter optimization can be performed by use of a plurality of measured values.

After optimizing the parameters of the optimum model, the control section 26 estimates an SOC of the secondary cell 30 by use of the optimum model whose parameters have been optimized, outputting the SOC to the vehicle ECU 10. For instance, Model 1 is set as an optimum model. After parameters of Model 1 are optimized, an amount of SOC correction is calculated from the estimated voltage value of Model 1 by use of the Karman filter. By use of the amount of SOC correction, a correction is made to an estimated SOC value determined by integration of an electric current, and a resultant SOC value is output as a final estimated SOC value. A model reflecting actual behavior is selected from among Model 1, Model 2, and Model 3 by use of an actually detected voltage value, whereby the accuracy of estimation of the SOC can be improved. Moreover, since parameters of a selected model are also optimized, the accuracy of estimation of the SOC can be enhanced further.

Second Embodiment

In the first embodiment, an optimum model is set, and parameters of the optimum model are next optimized. Conversely, however, parameters of respective models are first optimized, and an optimum model can also be set subsequently.

Figure 12:
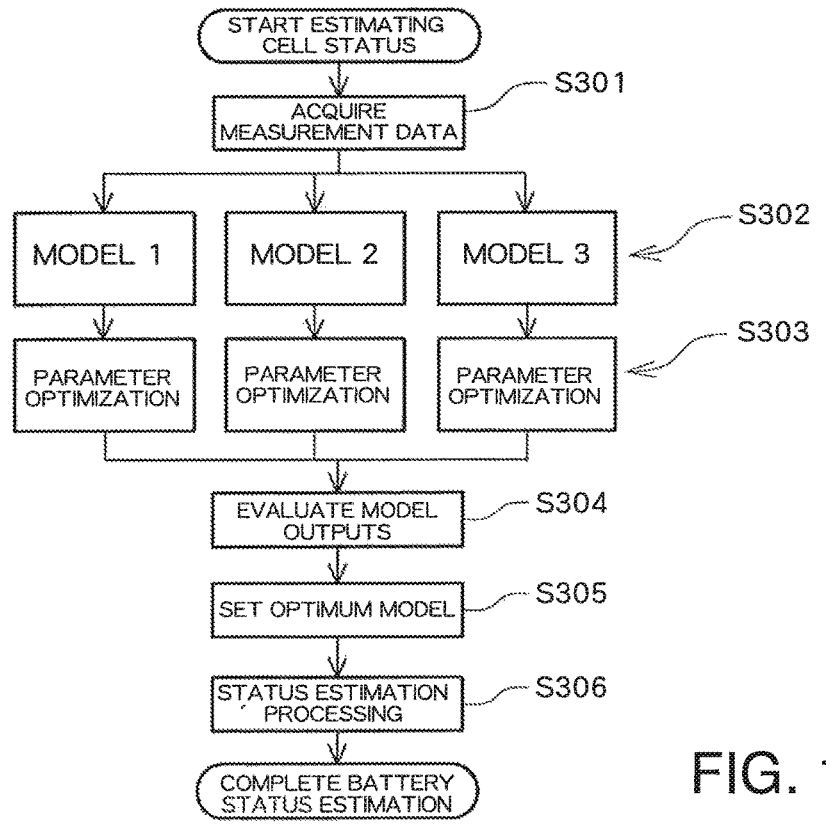
FIG. 12 is a processing flowchart of a second embodiment.

FIG. 12 illustrates a processing flowchart of the control section 28 of the embodiment. The processing flowchart differs from its counterpart illustrated in FIG. 3 in that parameters of respective models are optimized (S303) and that model outputs are then evaluated (S304), thereby setting an optimum model (S305). After the optimum model is set, the status of the secondary cell 30; specifically, an estimated SOC value, is output by use of the optimum model as in the case with FIG. 3 (S306).

Parameter optimization is similar to that described in connection with the first embodiment and performed by use of a measured current value and a measured voltage value in accordance with the recursive least square algorithm. Accordingly, optimum model setting of the present embodiment is hereunder described.

Figure 13:
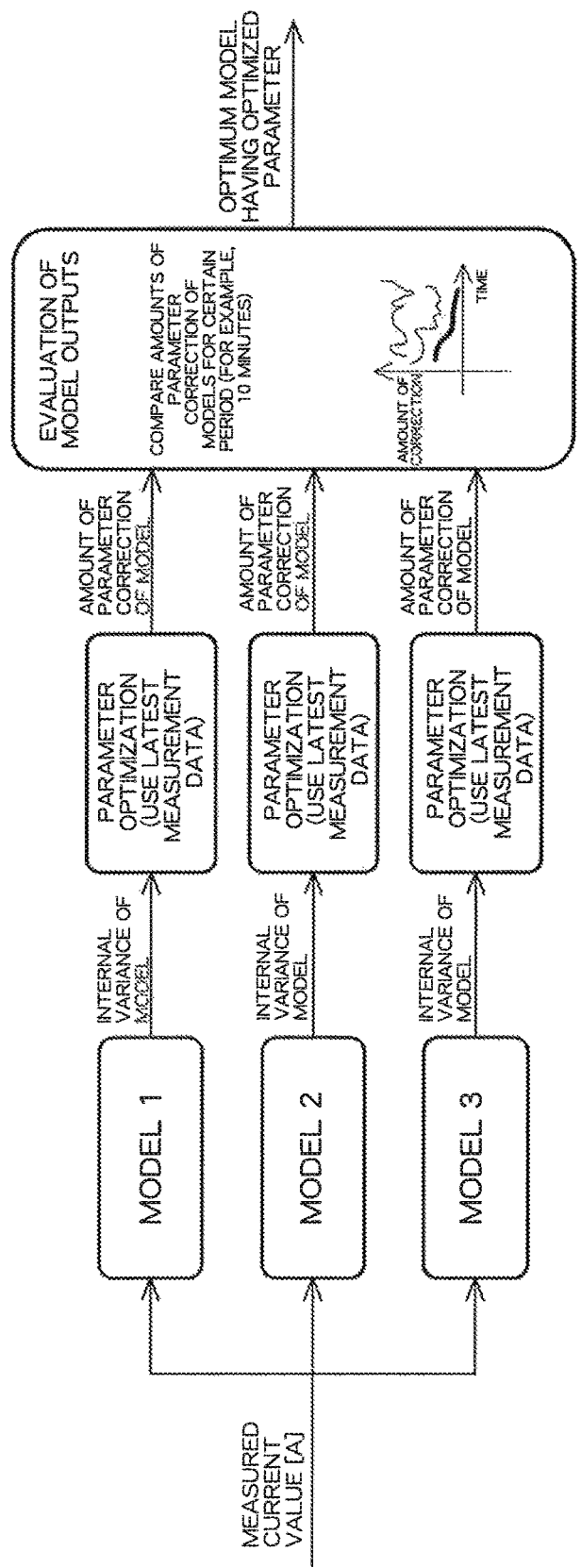
FIG. 13 is an explanatory view of evaluation of the model of the second embodiment.

FIG. 13 illustrates optimum model setting of the present embodiment. In each of Model 1, Model 2, and Model 3, an internal status of the model is optimized by use of a measured current value and a measured voltage value. An mount of parameter correction is calculated along with optimization. Let optimization of the parameter of Model 1; for example, be taken as an example, the parameter Θ(k) is updated by $\Theta(k) = \Theta(k-1) + G(k)[Vmeas(k) - Vemf(k) - \Theta^T(k)\Theta(k-1)]$.

The right-side second term of the equation is equivalent of an amount of parameter correction. An amount of parameter correction is defined as Amount of parameter correction $= G(k)[Vmeas(k) - Vemf(k) - \Theta^T(k)\Theta(k-1)]$.

The control section 26 sequentially computes an amount of parameter correction in a predetermined period; for instance, 10 minutes, for each of the models, detecting changes over time in the amount of parameter correction. If the amount of changes over time in parameter correction is large, it means that the model accordingly diverges from the actual behavior of the battery (the model is not analogous to the battery in terms of a tendency) and requires a correction and that the model is therefore inappropriate and does not reflect the actual behavior of the battery. In the meantime, when changes over time in the amount of parameter correction are small, the model is appropriate and reflects the actual behavior of the battery (i.e., the model is analogous to the batter in terms of the tendency). The control section 26 sets as an optimum model a model that undergoes the minimum changes over time in the amount of parameter correction. For instance, when changes in the amount of parameter correction of Model 3 appeared for 10 minutes are the least, Model 3 is set as an optimum model. Thus, an optimum model reflecting the actual behavior of the battery can be selected by use of the amount of parameter correction.

Since the parameters of the optimum model are already optimized after optimum model setting, an estimated SOC value of the optimum model is output as the status of the secondary cell 30. Specifically, as in the case with the first embodiment, the amount of SOC correction is calculated from an estimated voltage value of the optimum model by use of the Karman filter. By use of the amount of SOC correction, a correction is made to the estimated SOC value obtained by integration of an electric currents, and a resultant is output as a final estimated SOC value. Since the estimated SOC value is determined from the estimated voltage value of the optimum model that reflects the actual behavior of the battery, the accuracy of estimation of an SOC can be improved.

Even in the embodiment, the model output is evaluated at every predetermined period, and hence the optimum model can change at every predetermined period. For instance, Model 2 is set as an optimum model with regard to data for 10 minutes of time. Model 2 is successively set as an optimum model even with regard to data for the next 10 minutes of time, and Model 1 is set as an optimum model with regard to data for 10 minutes of time after next. An optimum model can thereby be set according to the situation.

Third Embodiment

In the first embodiment, after an optimum model selected from a plurality of models is set, parameters of the model are optimized. In the second embodiment, after parameters of a plurality of models are optimized, an optimum model is set. Each of the embodiments has its merits and demerits. Namely, the method described in connection with the first embodiment exhibits a relatively low degree of accuracy but is advantageous in that processing can be speeded up. The method described in connection with the second embodiment involves consumption of much processing time but is advantageous in a relatively higher degree of accuracy. Parameter optimization processing involves a relatively large amount of processing. When all models are subjected to parameter optimization, much time is eventually consumed. Accordingly, it is preferable to select an appropriate method depending on processing capability of the processor of the control section 26. When the processor has a relatively higher level of processing capability, the method of the second embodiment is used. In contrast, when the processor has a relatively lower level of processing capability, the method of the first embodiment is used.

Alternatively, it is also possible to use in combination the method of the first embodiment and the method of the second embodiment and switch between them as necessary according to the situation.

Figure 14:
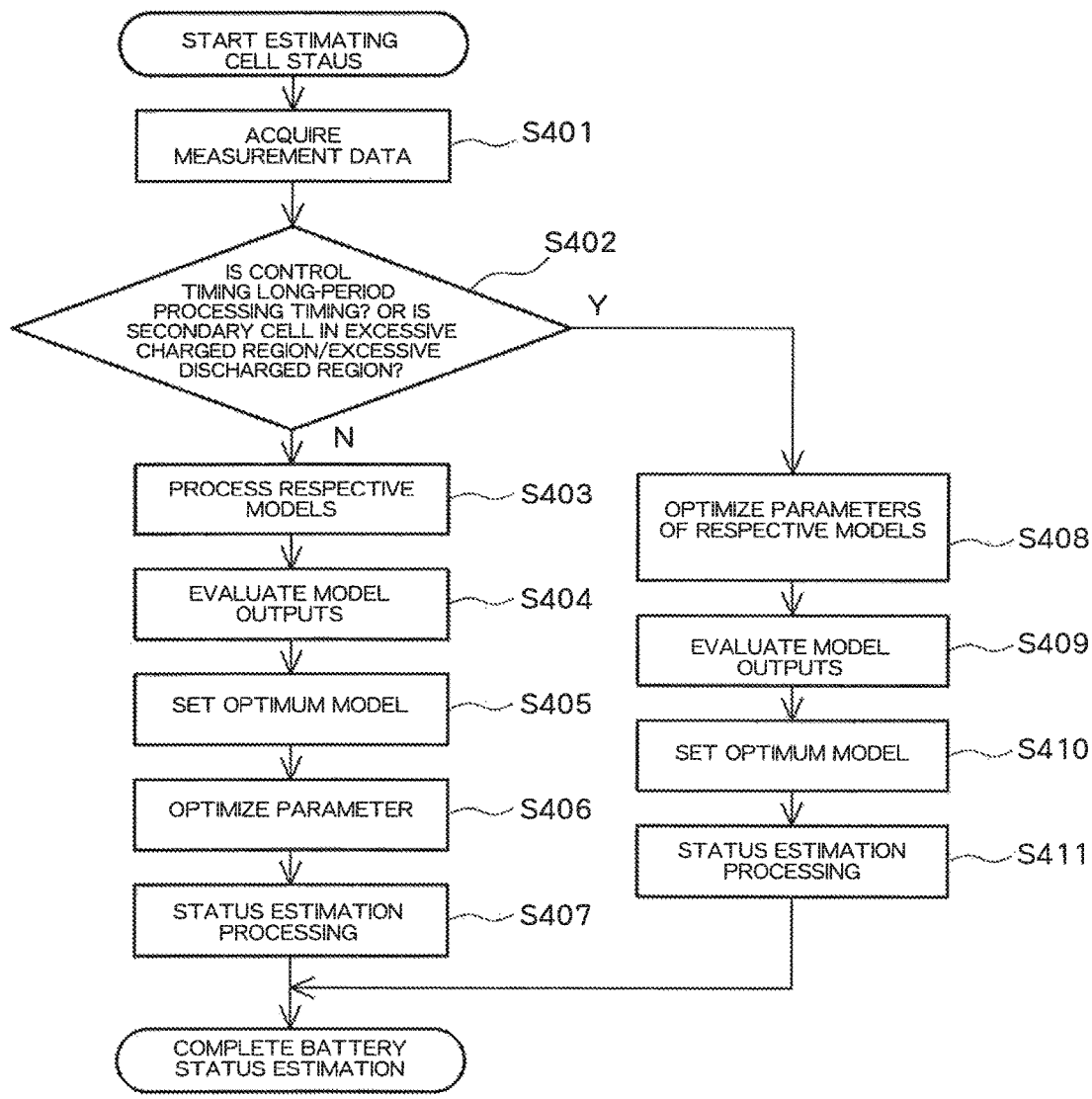
FIG. 14 is a processing flowchart of a third embodiment.

FIG. 14 illustrates a processing flowchart of the control section 26 of the present embodiment. First, when measurement data are acquired (S401), a determination is first made as to whether or not control timing is a long period of processing timing or whether or not the secondary cell 30 is in an excessively charged/excessively discharged region (S402). The expression "long period of processing timing" means timing at which the method of the second embodiment involving a relatively heavy processing load is to be performed; for instance, every hour. The expression "a short period of processing timing" means timing at which the method of the first embodiment involving a relatively light processing load is to be performed; for instance, every ten minutes. When current control timing is a short period of processing timing, processing pertaining to S403 to S407; namely, the method of the first embodiment, is performed. In the meantime, when the current control timing is long-hour processing timing, processing pertaining to S408 to S411; namely, the method of the second embodiment, is performed.

Moreover, when the secondary cell 30 is not in the excessively charged/excessively discharged region, even the method exhibiting a relatively lower degree of accuracy is deemed to be suffice, and processing pertaining to S403 to S407; namely, the method of the first embodiment, is performed. In contrast, when the secondary cell 30 is in the excessively charged/excessively discharged region, the method exhibiting a relatively higher degree of accuracy is determined to be required, so that processing pertaining to S408 to S411; namely, the method of the second embodiment, is performed. Incidentally, a determination can be made as to whether or not the secondary cell 30 is in the excessively charged/excessively discharged region on the basis of the previous estimated SOC value. When the estimated SOC value is in the vicinity of a predetermined lower limit value, the secondary cell can be determined to be in the excessively discharged region. On the contrary, when the estimated SOC value is in the vicinity of a predetermined upper limit value, the secondary cell can be determined to be in the excessively charged region. When the status of the secondary cell 30 is stable, the method of the first embodiment can also be said to be performed. In the meantime, when the status of the secondary cell 30 is unstable, the method of the second embodiment can also be said to be performed.

As above, when the status of the secondary cell 30 is estimated by switching between the method of the first embodiment and the method of the second embodiment, the followings are also conceivable. Specifically, a status is estimated at certain timing by the method of the first embodiment, and the status is again estimated at another timing by switching the method of the first embodiment to the method of the second embodiment. The status is further estimated at still another timing by switching the method of the second embodiment to the method of the first embodiment. In this case, since parameters of the respective models are optimized by the method of the second embodiment, the parameters optimized in accordance with the method of the second embodiment can be used as they are as parameters of the respective models at the next timing in accordance with the method of the first embodiment. Processing for setting an optimum model and subsequently optimizing parameters of the optimum model in accordance with the method of the first embodiment can thereby be omitted. The reason for this is that the parameters of the respective models are already optimized.

The embodiments of the present invention have been described thus far. The present invention; however, is not limited to the embodiments and is susceptible to various modifications.

For instance, the models illustrated in FIG. 4 to FIG. 9 are used as Model 1, Model 2, and Model 3 in each of the embodiments. However, other known models; for instance, a neural network model and an electrochemical model, can also be used. Features of the present invention are that, when the status of the secondary cell 30 is estimated by use of a plurality of models, an optimum model is set by evaluating which one of the models exhibits the highest likelihood and that the status of the secondary cell 30 is then estimated by use of the optimum model. An arbitrary model can be applied within the range of the technical idea. Selection of an optimum model is also not limited to the methods described in connection with the embodiments. For instance, statistical processing, like Bayes estimation, can also be used.

The present invention is also premised on a plurality of models. However, the most basic configuration is to use two models, or Model 1 and Model 2; determine which of the two is a model exhibiting a greater likelihood; and use the selected model. Such a configuration naturally falls within the present invention. The present invention is not limited in view of a type of secondary cell (e.g., a nickel-metal hydride battery, a lithium ion battery, and the like) and a shape (e.g., a cylindrical shape, an angular shape, a button-like shape, a laminate shape, and others).

What is claimed is:

1. A secondary cell system for estimating a secondary cell status comprising:
   a secondary rechargeable cell comprising a plurality of battery blocks connected in series;
   voltage detection means connected to the secondary cell for detecting a voltage of the secondary cell;
   current detection means connected to the secondary cell for detecting a current of the secondary cell;
   a vehicle engine control unit (ECU) and a battery control unit; and
   the battery electronic control unit is connected to the voltage detection means and the current detection means and that estimates the secondary cell status by use of a plurality of models, the battery electronic control unit performing steps including:
     optimizing parameters used respectively in the plurality of models by use of the voltage value detected by the voltage detection means,
     after optimizing the parameters, selecting, as an optimum model, a model involving least change in an amount of parameter correction from among the plurality of models having the optimized parameters, and
     then estimating the secondary cell status by use of the selected optimum model, wherein the plurality of models is selected from at least two of the following:
     a first model in which an estimated voltage is obtained by adding an estimated voltage drop due to an internal resistance (DCIR) of the secondary cell, an estimated linear polarization value and an estimated hysteresis value estimated by the use of a predetermined polarization voltage-model, and an electromotive voltage based on an SOC obtained by integrating a current of the secondary cell;
     a second model in which the estimated voltage is obtained by adding the estimated DCIR voltage drop, an estimated short-term linear polarization value and an estimated long-term linear polarization value estimated by the use of the polarization voltage model, and the electromotive voltage based on the SOC; and
     a third model in which the estimated voltage is obtained by adding the estimated DCIR voltage drop, the estimated short-term linear polarization value and the estimated long-term polarization value estimated by the use of the polarization voltage model, and an electromotive voltage obtained by the use of a predetermined dynamic battery model; and
     transmitting, at least, the cell status to a vehicle ECU, wherein the vehicle ECU controls the charging and discharging of the secondary cell;
     based at least on the cell status, the ECU outputs a control command discharging the secondary cell to an DC to AC inverter to power an electric motor;
     based at least on the cell status, the ECU outputs a control command charging the secondary cell by actuating an engine and generator.

2. The secondary cell system for estimating a secondary cell status according to claim 1, wherein the computation means optimizes the parameters used respectively in the plurality of models at every predetermined period and selects, as an optimum model, the model involving the least change in the amount of parameter correction acquired from the plurality of models having the optimized parameters.

3. The secondary cell system for estimating a secondary cell status according to claim 1, wherein the parameter is optimized by means of any two or more selected from among the voltage value detected by the voltage detection means, a current value detected by current detection means, and a temperature detected by temperature detection means.

4. The secondary cell system of claim 1, further comprising a vehicle electronic control unit, wherein the battery electronic control unit transmits the detected state of charge to the vehicle electronic control unit, and the vehicle electronic control unit controls charging the secondary cell status based on at least the detected state of charge.

5. The secondary cell system of claim 1, wherein the plurality of models output an estimated voltage.

6. A vehicle including the secondary cell system of claim 1, further comprising:
   an engine;
   a generator connected to the engine through a power splitting mechanism, wherein the generator charges the secondary cell;
   a motor connected to an inverter, wherein the secondary cell is discharged through the inverter; and
   a drive shaft connected to the engine through the power splitting mechanism and the drive shaft is connected to the motor.

7. The secondary cell system for estimating a secondary cell status according to claim 1, wherein the polarization voltage model in the first model is formed by a parallel connection of a resistor and a capacitor.

8. The secondary cell system for estimating a secondary cell status according to claim 1, wherein the electromotive voltage in the first model and the second model is obtained by the use of a relationship between the SOC and the electromotive voltage which is set in advance.

9. The secondary cell system for estimating a secondary cell status according to claim 1, wherein the polarization voltage model in the second model and the third model is formed by a parallel connection of a short-term polarization resistor and a short-term polarization capacitor and a parallel connection of a long-term polarization resistor and a long-term polarization capacitor.

10. The secondary cell system for estimating a secondary cell status according to claim 1, wherein the dynamic battery model in the third model is a model in which, when electric charges include bound charges QB and available charges QA, a capacity ratio of the bound charges is 1−C, and a capacity ratio of the available charges is C, voltages h1 and h2 are expressed as:

$$h1=QA/C, \text{ and}$$

$$h2=QB/(1-C),$$

wherein, when i is a current and k is a parameter, $$dQA/dt=-i+k(h2-h1), \text{ and}$$

$$dQB/dt=-k(h2-h1).$$

11. The secondary cell system for estimating a secondary cell status according to claim 1, wherein a parameter $\Theta(k)$ which is used respectively in the plurality of models is updated, in the optimizing step, by $$\Theta(k)=\Theta(k-1)+G(k)[Vmeas(k)-Vemf(k)-\Theta^T(k)\Theta(k-1)]$$

where k is a parameter of time-sequential data, Vmeas(k) is a time-sequential measured voltage, Vemf is a time-sequential electromotive voltage, $\Phi$ is a vector having an estimated value as a component, and G is a gain, and the amount of parameter correction is given by $G(k)[Vmes(k)-Vemf(k)-\Phi^T(k)\Theta(k-1)]$.

12. The secondary cell system for estimating a secondary cell status according to claim 1, wherein the process further performs a step of determining an excessively charged secondary cell when the estimated state of charge value is in a vicinity of a predetermined lower limit or determining an excessively charged secondary cell when the estimated state of charge is in a vicinity of a predetermined upper limit, and, for a secondary cell that is not excessively charged or discharged, selecting an optimum model from the plurality of models by use of the voltage value detected by the voltage detection means, and then optimizing parameters in the selected optimum model.

* * * * *